(12) United States Patent
Kivioja et al.

(10) Patent No.: US 8,592,888 B2
(45) Date of Patent: Nov. 26, 2013

(54) FIELD EFFECT TRANSISTOR FOR SENSING DEFORMATION

(75) Inventors: Jani Kivioja, Cambridge (GB); Richard White, Huntington (GB)

(73) Assignee: Nokia Corporation, Espoo (FI)

( * ) Notice: Subject to any disclaimer, the term of this patent is extended or adjusted under 35 U.S.C. 154(b) by 188 days.

(21) Appl. No.: 13/205,974

(22) Filed: Aug. 9, 2011

(65) Prior Publication Data

US 2013/0037780 A1 Feb. 14, 2013

(51) Int. Cl.
*H01L 29/12* (2006.01)
(52) U.S. Cl.
USPC .......................................... 257/318; 438/704
(58) Field of Classification Search
USPC .................. 257/314–318, E21.679; 365/177; 438/704
See application file for complete search history.

(56) References Cited

U.S. PATENT DOCUMENTS

| | | | |
|---|---|---|---|
| 4,873,871 A | 10/1989 | Bai et al. | 73/777 |
| 2006/0038167 A1 | 2/2006 | Hakey et al. | 257/24 |
| 2007/0092989 A1* | 4/2007 | Kraus et al. | 438/99 |
| 2008/0306407 A1 | 12/2008 | Taylor | 600/587 |
| 2009/0011585 A1* | 1/2009 | Marsh | 438/591 |
| 2009/0173991 A1* | 7/2009 | Marsh et al. | 257/324 |
| 2009/0293631 A1 | 12/2009 | Radivojevic | 73/774 |

FOREIGN PATENT DOCUMENTS

| | | |
|---|---|---|
| EP | 2 290 345 A2 | 3/2011 |
| GB | 2 174 839 A | 11/1986 |
| JP | 2007178256 A | 7/2007 |
| WO | WO 2012/119125 A2 | 9/2012 |

OTHER PUBLICATIONS

Tao, A., et al., "Tunable Plasmonic Lattices of Silver Nanocrystals", © 2007 Nature Publishing Group, pp. 435-440.
Huang, F., et al., "Actively Tuned Plasmons on Elastomerically Driver Au Nanoparticle Dimers", © 2010 American Chemical Society, pp. 1787-1792.
Simmons, J.G., "Generalized Formula for the electric Tunnel Effect Between Similar Electrodes Separated by a Thin Insulating Film", Jun. 1963, Journal of Applied Physics, pp. 1793-1803.
Park, Y-K, et al., "Directing Close-Packing of Midnanosized Gold Nanoparticles at a Water/Hexane Interface", © 2008 American Chemical Society, pp. 2388-2393.
Reincke, F., et al., "Spontaneous Assembly of a Monolayer of Charged Gold Nanocrystals at the Water/Oil Interface", © 2004 Wiley-VCH Verlag GmbH & Co. KGaA, Weinheim, pp. 458-462.
Markovich, G., et al., "Reversible Metal-Insulator Transition in Ordered metal Nanocrystal Monolayers Observed by Impedance Spectroscopy", © 1998 The American Physical Society, pp. 3807-3810.
Martin, M.N., et al., "Charged Gold Nanoparticles in Non-Polar Solvents: 10-min Synthesis and 2D Self-Assembly", © 2010 American Chemical Society, pp. 7410-7417.

* cited by examiner

*Primary Examiner* — Thomas L Dickey
(74) *Attorney, Agent, or Firm* — Harrington & Smith

(57) ABSTRACT

An apparatus including a first layer configured to enable a flow of charge carriers from a source electrode to a drain electrode, a second layer configured to control the density of charge carriers in the first layer using an electric field formed between the first and second layers, and a third layer positioned between the first and second layers to shield the first layer from the electric field, wherein the third layer includes a layer of electrically conducting nanoparticles and is configured such that when stress is applied to the third layer, the strength of the electric field experienced by the first layer is varied resulting in a change in the charge carrier density and a corresponding change in the conductance of the first layer.

19 Claims, 11 Drawing Sheets

FIELD EFFECT TRANSISTOR FOR SENSING DEFORMATION

TECHNICAL FIELD

The present disclosure relates to the field of flexible/stretchable electronics, associated methods and apparatus, and in particular concerns a field effect transistor configured to sense physical deformation of an apparatus. Certain disclosed example aspects/embodiments relate to portable electronic devices, in particular, so-called hand-portable electronic devices which may be hand-held in use (although they may be placed in a cradle in use). Such hand-portable electronic devices include so-called Personal Digital Assistants (PDAs).

The portable electronic devices/apparatus according to one or more disclosed example aspects/embodiments may provide one or more audio/text/video communication functions (e.g. tele-communication, video-communication, and/or text transmission, Short Message Service (SMS)/Multimedia Message Service (MMS)/emailing functions, interactive/non-interactive viewing functions (e.g. web-browsing, navigation, TV/program viewing functions), music recording/playing functions (e.g. MP3 or other format and/or (FM/AM) radio broadcast recording/playing), downloading/sending of data functions, image capture function (e.g. using a (e.g. in-built) digital camera), and gaming functions.

BACKGROUND

Flexible and stretchable electronics allow new form factors of device to be manufactured, and also enable sophisticated user interface concepts based on deformation of the system. For user interface applications, it is beneficial (and sometimes even necessary) to be able to detect the current shape of the system and/or measure the spatial distribution of the deformation. This may be performed using a network of strain gauges. Such systems, however, tend to be bulky, complex and relatively expensive. In addition, the large size of the strain gauges limits the spatial resolution of the system and inhibits device miniaturization.

The apparatus and methods disclosed herein may or may not address this issue.

The listing or discussion of a prior-published document or any background in this specification should not necessarily be taken as an acknowledgement that the document or background is part of the state of the art or is common general knowledge. One or more aspects/embodiments of the present disclosure may or may not address one or more of the background issues.

SUMMARY

According to a first aspect, there is provided an apparatus comprising:
a first layer configured to enable a flow of charge carriers from a source electrode to a drain electrode,
a second layer configured to control the density of charge carriers in the first layer using an electric field formed between the first and second layers, and
a third layer positioned between the first and second layers to shield the first layer from the electric field,
wherein the third layer comprises a layer of electrically conducting nanoparticles and is configured such that when stress is applied to the third layer, the strength of the electric field experienced by the first layer is varied resulting in a change in the charge carrier density and a corresponding change in the conductance of the first layer.

The stress applied to the third layer may be compressive, tensile or shearing stress. The stress applied to the third layer may cause one or more of the following: a change in the position of the nanoparticles, a change in the shape of the nanoparticles, a change in the orientation of the nanoparticles, and a change in the distance between adjacent nanoparticles. The change in position, shape, orientation and/or spacing of the nanoparticles may cause the change in effective field strength and therefore the change in electrical conductance.

The apparatus may be configured such that an increase or decrease in the distance between adjacent nanoparticles causes an increase or decrease in the field strength experienced by the first layer, respectively.

The electric field may be provided by at least the second layer. The electric field may be formed when a potential difference is applied between the first and second layers. The apparatus may comprise a body or substrate electrode configured such that the electric field is formed when a potential difference is applied between the second layer and the body/substrate electrode.

The third layer may be configured such that the distance between adjacent nanoparticles in the plane of the third layer is varied when a component of compressive or tensile stress is parallel to the plane of the third layer. The third layer may be configured such that the orientation of the nanoparticles is varied when a component of shearing stress is parallel to the plane of the third layer.

The apparatus may be configured such that one or more of the first, second and third layers is reversibly deformable. The apparatus may be configured such that one or more of the first, second and the third layers is optically transparent.

The first and/or second layers may be formed from at least one or more layers of graphene. The second layer may comprise one or more of graphene, single-layer graphene platelets, multi-layer graphene platelets, a carbon nanotube network and a metallic nanowire mesh. The multi-layer graphene platelets may comprise 2-10, 10-50, 50-100 or >100 graphene layers on average.

The layer of electrically conducting nanoparticles may comprise one or more monolayers of electrically conducting nanoparticles. The number of monolayers at different regions/areas of the third layer may vary. The electrically conducting nanoparticles may be metallic nanoparticles. The electrically conducting nanoparticles may be gold nanoparticles. The average diameter of the electrically conducting nanoparticles may be between 1 and 1000 nm, between 5 and 40 nm or between 10 and 20 nm. The average unstressed inter-particle spacing may be less than or equal to 1 nm.

The apparatus may be configured such that the electrically conducting nanoparticles are electrically coupled to one another by one or more of capacitive coupling and quantum mechanical coupling. One or more of the orientation, density and separation of the electrically conducting nanoparticles may be configured to enable the electrical coupling therebetween.

The third layer may be formed from at least an electrically insulating material configured to prevent direct physical contact between adjacent electrically conducting nanoparticles of the third layer. The electrically insulating material may be configured to prevent direct physical contact between the second layer and the electrically conducting nanoparticles. The electrically insulating material may be configured to prevent direct physical contact between the first layer and the electrically conducting nanoparticles. The electrically insulating material may comprise a surfactant. The surfactant may comprise an alkanethiol. The surfactant may comprise dodecanethiol.

The apparatus may comprise a further layer between the second and third layers. The further layer may comprise an electrically insulating material configured to prevent direct physical contact between the second layer and the electrically conducting nanoparticles. The apparatus may comprise a further layer between the first and third layers. The further layer may comprise an electrically insulating material configured to prevent direct physical contact between the electrically conducting nanoparticles and the first layer. The electrically insulating material of the further layer(s) may comprise a hydrophobin protein.

The apparatus may comprise a substrate. The first, second and third layers may be positioned on top of the substrate. The substrate may be reversibly deformable. The substrate may comprise an elastomer. The substrate may comprise at least one of polydimethylsiloxane (PDMS) and polyethylene terephthalate (PET).

The apparatus may comprise two or more channels. Each channel may be configured to enable a flow of charge carriers from a source electrode to a drain electrode. The apparatus may comprise two or more gate electrodes. Each gate electrode may be configured to control the density of charge carriers in one or more channels using an electric field formed between the gate electrode and the respective channels. The channels and gate electrodes may be arranged to form a multiplexing architecture. At least one of the two or more gate electrodes may comprise side guards configured to confine the electric field of the gate electrode. The channels may be arranged substantially parallel to one another. The gate electrodes may be arranged substantially parallel to one another. The channels may be arranged substantially perpendicular to the gate electrodes.

The apparatus may comprise source and drain electrodes. The source and drain electrodes may comprise one or more of platinum, titanium, gold and graphene.

The apparatus may be one or more of a deformation sensor, a surface coating, and a field effect transistor.

According to a further aspect, there is provided a device comprising any apparatus described herein. The device may be at least one of the following: an electronic device, a portable electronic device, a portable telecommunications device, an electronic display for any of the aforementioned devices, and a module for any of the aforementioned devices.

According to a further aspect, there is provided a method comprising:
  depositing a first layer;
  depositing a third layer on top of the first layer; and
  depositing a second layer on top of the third layer to form an apparatus comprising a first layer configured to enable a flow of charge carriers from a source electrode to a drain electrode, a second layer configured to control the density of charge carriers in the first layer using an electric field formed between the first and second layers, and a third layer positioned between the first and second layers to shield the first layer from the electric field, wherein the third layer comprises a layer of electrically conducting nanoparticles and is configured such that when stress is applied to the third layer, the strength of the electric field experienced by the first layer is varied resulting in a change in the charge carrier density and a corresponding change in the conductance of the first layer.

According to a further aspect, there is provided a method comprising:
  providing/using an apparatus comprising a first layer configured to enable a flow of charge carriers from a source electrode to a drain electrode, a second layer configured to control the density of charge carriers in the first layer using an electric field formed between the first and second layers, and a third layer positioned between the first and second layers to shield the first layer from the electric field, wherein the third layer comprises a layer of electrically conducting nanoparticles and is configured such that when stress is applied to the third layer, the strength of the electric field experienced by the first layer is varied resulting in a change in the charge carrier density and a corresponding change in the conductance of the first layer; and
  measuring the conductance of the first layer.

The method may comprise applying stress to the apparatus. The method may comprise detecting a change in conductance of the first layer caused by the applied stress.

According to a further aspect, there is provided an apparatus comprising:
  a channel configured to enable a flow of charge carriers from a source electrode to a drain electrode,
  a gate electrode configured to control the density of charge carriers in the channel using an electric field formed between the gate electrode and the channel, and
  a shield layer positioned between the channel and the gate electrode to shield the channel from the electric field,
  wherein the shield layer comprises a layer of electrically conducting nanoparticles and is configured such that when stress is applied to the shield layer, the strength of the electric field experienced by the channel is varied resulting in a change in the charge carrier density and a corresponding change in the conductance of the channel.

According to a further aspect, there is provided a method comprising:
  depositing a channel layer;
  depositing a shield layer on top of the channel layer; and
  depositing a gate electrode on top of the shield layer to form an apparatus comprising a channel configured to enable a flow of charge carriers from a source electrode to a drain electrode, a gate electrode configured to control the density of charge carriers in the channel using an electric field formed between the gate electrode and the channel, and a shield layer positioned between the channel and the gate electrode to shield the channel from the electric field, wherein the shield layer comprises a layer of electrically conducting nanoparticles and is configured such that when stress is applied to the shield layer, the strength of the electric field experienced by the channel is varied resulting in a change in the charge carrier density and a corresponding change in the conductance of the channel.

According to a further aspect, there is provided a method comprising:
  providing/using an apparatus comprising a channel configured to enable a flow of charge carriers from a source electrode to a drain electrode, a gate electrode configured to control the density of charge carriers in the channel using an electric field formed between the gate electrode and the channel, and a shield layer positioned between the channel and the gate electrode to shield the channel from the electric field, wherein the shield layer comprises a layer of electrically conducting nanoparticles and is configured such that when stress is applied to the shield layer, the strength of the electric field experienced by the channel is varied resulting in a change in the charge carrier density and a corresponding change in the conductance of the channel; and measuring the conductance of the channel.

The steps of any method disclosed herein do not have to be performed in the exact order disclosed, unless explicitly stated or understood by the skilled person.

According to a further aspect, there is provided a computer program, recorded on a carrier, the computer program comprising computer code configured to perform any method described herein.

The apparatus may comprise a processor configured to process the code of the computer program. The processor may be a microprocessor, including an Application Specific Integrated Circuit (ASIC).

The present disclosure includes one or more corresponding aspects, example embodiments or features in isolation or in various combinations whether or not specifically stated (including claimed) in that combination or in isolation. Corresponding means for performing one or more of the discussed functions are also within the present disclosure.

Corresponding computer programs for implementing one or more of the methods disclosed are also within the present disclosure and encompassed by one or more of the described example embodiments.

The above summary is intended to be merely exemplary and non-limiting.

BRIEF DESCRIPTION OF THE FIGURES

A description is now given, by way of example only, with reference to the accompanying drawings, in which.

DESCRIPTION OF SPECIFIC ASPECTS/EMBODIMENTS

As mentioned in the background section, deformation sensors formed using strain gauges are bulky, complex and relatively expensive. In addition, the large size of the strain gauges limits the spatial resolution of the system and inhibits device miniaturization. There will now be described an apparatus and associated methods that may or may not provide a solution to this problem.

Figure 1:
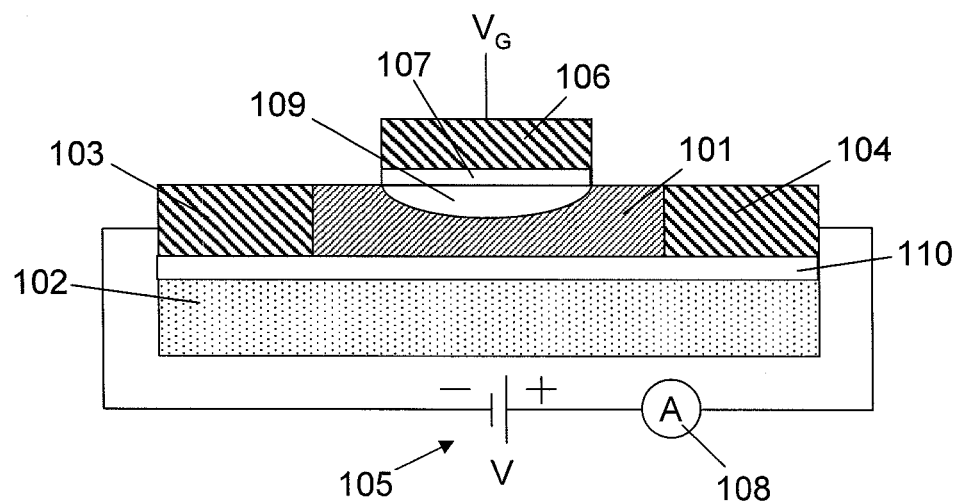
FIG. 1 shows a conventional field effect transistor.

The present apparatus comprises one or more field effect transistors (FETs). An FET is a type of transistor in which an electrical current is carried along a conduction channel, the conductance of which can be controlled by a transverse electric field. In a standard (planar) FET, as illustrated in FIG. 1, a semiconductor such as p-type silicon 101 is supported on a substrate 102 (coated with an electrically insulating layer 110) and connected to metal source 103 and drain 104 electrodes. A current is injected and collected via the source and drain electrodes, respectively, by applying a potential difference 105 across the semiconductor. The conductance of the semiconductor between the source and drain electrodes is switched on and off by a third electrode, the gate electrode 106, capacitively coupled through a thin dielectric layer 107. Conductance may be determined by measuring the current through the semiconductor (using an ammeter 108, for example) and dividing by the potential difference. With p-type silicon (or another p-type semiconductor), application of a positive gate voltage depletes charge carriers (creating a depletion region 109 in the semiconductor) and reduces the conductance, whilst applying a negative gate voltage leads to an accumulation of charge carriers (creating a conductive region) and an increase in conductance.

As described above, the conductance of the channel is controlled (at least in part) by the voltage applied to the gate electrode. For sensing physical deformation, however, the apparatus needs to be sensitive to applied stress (force). To achieve this, the present apparatus (FIG. 2) comprises a shield layer 211 positioned between the conduction channel 201 and the gate electrode 206 to shield the charge carriers from the electric field formed between the gate electrode 206 and the channel 201. The shield layer comprises a layer of electrically conducting nanoparticles 212 (e.g. gold nanoparticles) and is configured such that when compressive or tensile (or possibly shearing) stress is applied to the shield layer 211, the distance between the adjacent nanoparticles 212 is varied. The applied stress may also cause a change in the position, shape and/or orientation of the nanoparticles 212. This in turn causes a change in the effective gate capacitance and a change in the charge/potential distribution in the shield layer 211, which varies the strength of the electric field experienced by the channel 201. Since the electric field causes a change in the charge carrier density in the conduction channel 201, and the conductance of the channel is proportional to the charge carrier density (and also the mobility of the charge carriers), the change in electric field strength as a result of the applied stress causes a change in the conductance of the channel 201. In this way, physical deformation of the apparatus can be detected by changes in the conductance of the FET channel 201. Whilst the present apparatus may be used in the depletion or enhancement modes, only the depletion mode (i.e. where the electric field of the gate electrode creates a depletion region in the conduction channel rather than a conductive region) is described herein. For quantitative measurements, the conductance vs stress curve may be calibrated prior to use of the apparatus. Furthermore, by using a plurality of FETs (discussed later), it is possible to determine the spatial distribution of the deformation.

The conduction channel 201 and gate electrode 206 may be formed as layers of material, typically patterned on top of a substrate. As a result, the terms "(conduction) channel", "gate electrode", "shield layer" and "separator layer" (see below) may be used interchangeably with the terms "first layer", "second layer", "third layer" and "further layer", respectively.

The shield layer 211 typically comprises a dense, highly oriented monolayer of nanoparticles 212, and is configured such that the distance between adjacent nanoparticles 212 in the plane of the shield layer 211 is varied when a component of the applied compressive or tensile stress is parallel to the plane of the shield layer 211. In practice, this may be achieved by bending/flexing, stretching or compressing the apparatus. In some cases, the application of force perpendicular to the shield layer 211 (i.e. no parallel component) may vary the inter-particle distance by displacing the underlying nanoparticles 212 in opposite directions.

In order to achieve the above-mentioned functionality, the apparatus must comprise flexible and/or stretchable materials. Preferably, one or more of the conduction channel 201, the gate electrode 206, the shield layer 211 and the supporting substrate 202 are made from reversibly deformable materials to allow repeated sensing experiments. For example, the conduction channel 201 may comprise graphene; the gate electrode 206 may comprise one or more of graphene, graphene platelets, a carbon nanotube network and a metallic nanowire mesh; the shield layer 211 may comprise a composite of metallic nanoparticles and alkanethiol molecules (such as dodecanethiol); and the supporting substrate 202 may comprise an elastomer such as PDMS or PET.

In some embodiments, the apparatus may also comprise a separator layer 213 between the gate electrode 206 and the shield layer 211 to prevent direct physical contact between the gate electrode 206 and the electrically conducting nanoparticles 212, and/or a separator layer 214 between the shield layer 211 and the conduction channel 201 to prevent direct physical contact between the electrically conducting nanoparticles 212 and the channel 201. In these embodiments, the separator layer(s) 213, 214 may comprise an electrically insulating material such as a hydrophobin protein monolayer, or an electrically insulating polymer such as PDMS.

As well as being reversibly deformable, it is also preferable if the materials used to form the conduction channel 201, gate electrode 206, shield layer 211 and/or supporting substrate 202 are optically transparent. This feature allows the apparatus to be integrated on or within touch-sensitive displays (or other visible device component) without any adverse optical impact.

Figure 2:
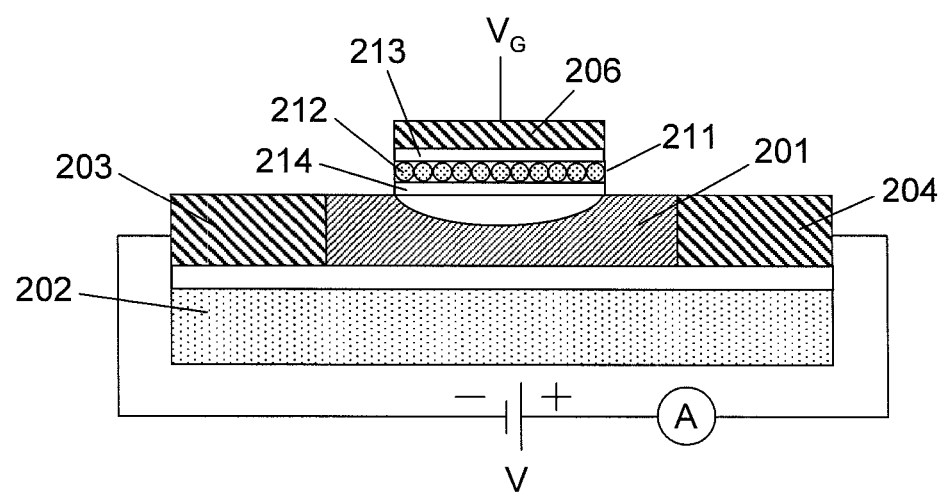
FIG. 2 shows a field effect transistor comprising a layer of electrically conducting nanoparticles positioned between the gate electrode and the conduction channel.
Figure 3:
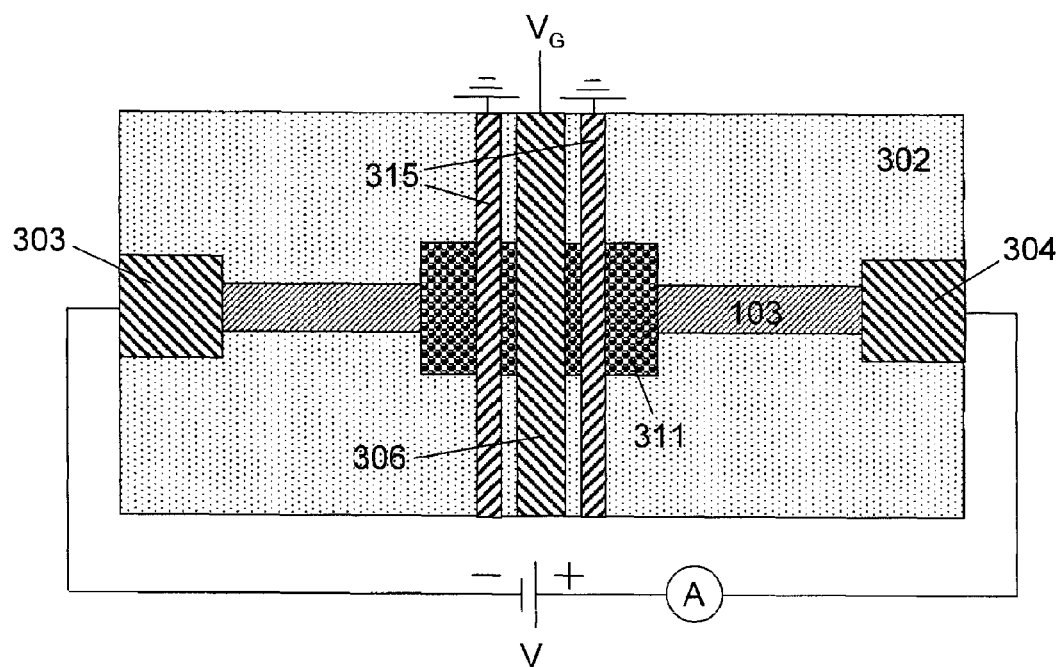
FIG. 3 shows the field effect transistor of FIG. 2 in plan view.

FIG. 3 shows a plan view of the apparatus illustrated in FIG. 2. In this figure, however, the apparatus further comprises electrically-grounded side guards 315 on either side of the gate electrode to confine the electric field. This is important when multiple gate electrodes 306 are used (as discussed later), otherwise cross-talk between adjacent gate electrodes can hamper operation of the apparatus. In addition, the side guards 315 help to (capacitively) ground the underlying shield layer 311. Effective grounding of the shield layer 311 is required to maximise modulation of the electric field when the apparatus is deformed. In cases where the area of the shield layer 311 is far greater than the area of the underlying channel 301, the self-capacitance of the nanoparticles may be sufficient to ground the shield layer 311 without the need for additional side guards 315.

Figure 4A:
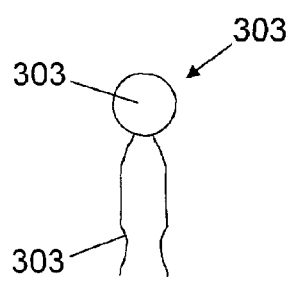
FIG. 4*a* shows an amphiphilic surfactant molecule.
Figure 4B:
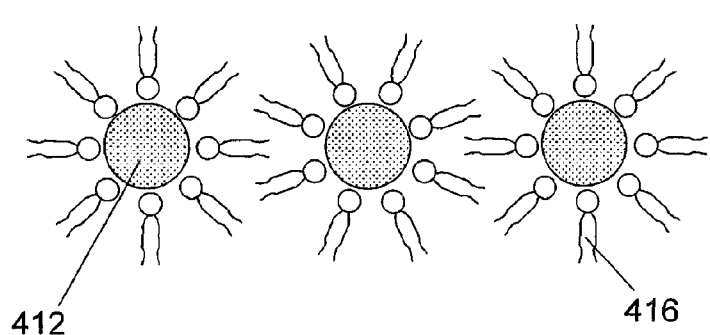
FIG. 4*b* shows a plurality of electrically conducting nanoparticles separated from one another by amphiphilic surfactant molecules.

The electrically conducting nanoparticles 412 of the shield layer may be physically separated from one another by the use of electrically-insulating amphiphilic surfactant molecules 416 (FIG. 4a), e.g. alkanethiols such as dodecanethiol. With alkanethiol molecules 416, the thiol group 417 covalently bonds to the nanoparticle surface and the hydrophobic alkane chain 418 extends approximately radially from the nanoparticle 412. Although the surfactant molecules 416 from adjacent nanoparticles 412 interpenetrate, they prevent direct physical contact between the nanoparticles 412 when the apparatus is in an unstressed state (FIG. 4b). The average distance between adjacent nanoparticles 412 in the unstressed state is dependent upon the particular surfactant 416 (i.e. alkane chain length) and may be tailored appropriately. The use of surfactant molecules is not absolutely necessary, however, and other techniques may be adopted to control the nanoparticle separation. For example, if the nanoparticles are electrically charged, Coulombic repulsion may be used. Alternatively, if Langmuir-Blodgett self-assembly is used to form the monolayer (see later), the average particle separation is a function of the compression applied to the nanoparticles in the Langmuir-Blodgett trough.

Figure 5:
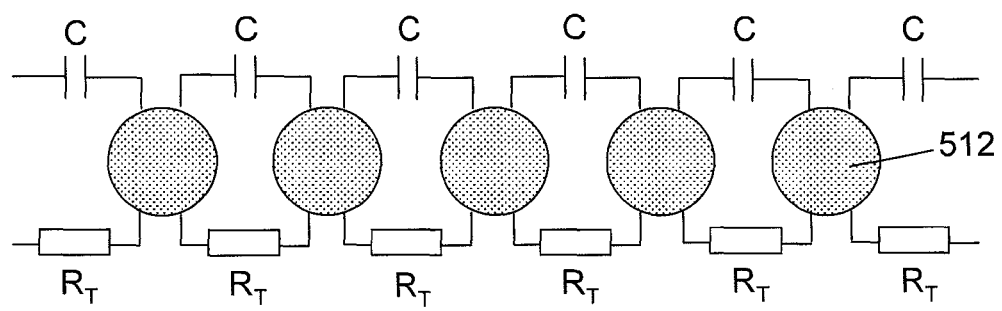
FIG. 5 shows a plurality of nanoparticles electrically coupled to one another by capacitive coupling and quantum mechanical tunneling.

When the inter-particle spacing is less than 1 nm (approximately), adjacent nanoparticles 512 are electrically coupled to one another by capacitive coupling and quantum mechanical coupling (FIG. 5). In this figure, the terms "C" and "$R_T$" denote the capacitance between adjacent nanoparticles 512 and the resistance of the tunnel barrier between adjacent nanoparticles 512, respectively.

As well as being capacitively coupled to one another, each nanoparticle is also capacitively coupled to the surrounding environment. This so-called "self-capacitance" can dominate the total capacitance of the shield layer when the number of nanoparticles is large, as described below. The total capacitance of the shield layer ($C_{total}$) is a superposition of parallel capacitances between (i) the gate electrode and the shield layer ($C_{gate}$), (ii) the side guards and the shield layer ($C_{guard}$), (iii) the shield layer and the channel ($C_{channel}$), and (iv) the shield layer and the surrounding environment ($C_{self}$), as given by Equation 1

$$C_{total} \approx C_{gate} + 2C_{guard} + C_{channel} + C_{self} \quad \text{Equation 1}$$

Figure 6A:
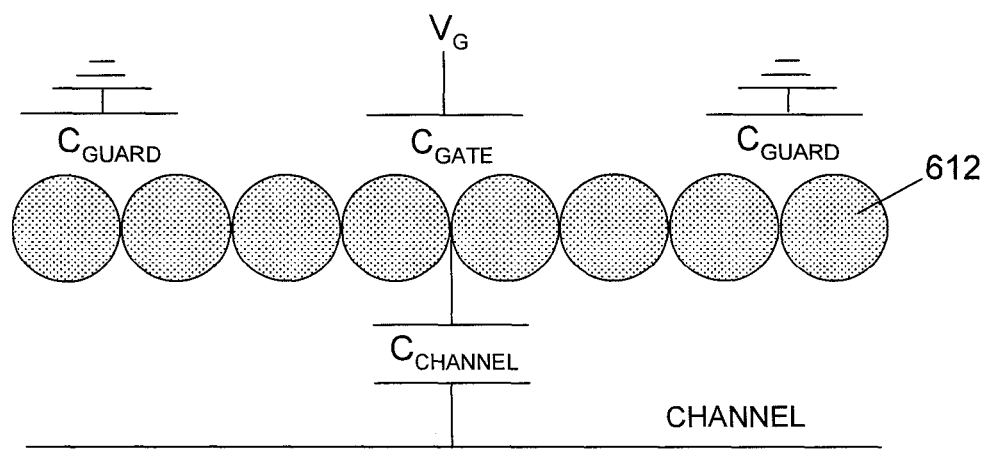
FIG. 6*a* shows the layer of electrically conducting nanoparticles under compressive stress.
Figure 6B:
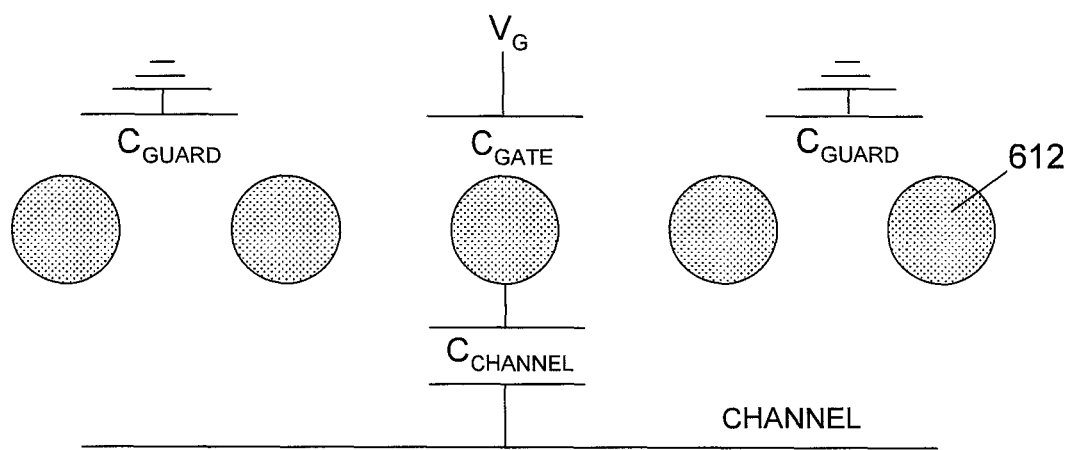
FIG. 6*b* shows the layer of electrically conducting nanoparticles under tensile stress.

FIGS. 6a and 6b illustrate two extreme conditions of deformation. Under the first condition (FIG. 6a), the apparatus is compressed such that the adjacent nanoparticles 612 are touching one another (inter-particle spacing→0). In this scenario, the tunneling resistance is virtually zero and the monolayer acts as a continuous metallic film (i.e. quantum mechanical coupling dominates over capacitive coupling).

The effective gate capacitance (i.e. the capacitance which contributes to the electric field experienced by the conduction channel) is given by $$C_{gate}^{eff} \approx \frac{C_{channel} C_{gate}}{C_{total}} \qquad \text{Equation 2}$$

The self-capacitance of the shield layer is given by $nc_{self}$, where "n" is the number of nanoparticles and "$c_{self}$" is the capacitance between each nanoparticle and the surrounding environment. Therefore, when the shield layer comprises a large number of electrically conducting nanoparticles 612, the effective gate capacitance is negligible (i.e. the metallic film shields or screens the gate electrode completely). In this situation, the conduction channel experiences negligible electric field and the conductance of the channel is large (i.e. small depletion region).

In the second condition (FIG. 6b), the apparatus is stretched such that the adjacent nanoparticles 612 are considerably isolated from one another (inter-particle spacing ≥ 1 nm). In this scenario, capacitive and quantum mechanical coupling between adjacent nanoparticles 612 is negligible and the effective gate capacitance is comparable to the geometric gate capacitance. As a result, the conduction channel experiences the full electric field of the gate electrode and the conductance of the channel is small (i.e. large depletion region).

Rather than considering the total capacitance of the shield layer in terms of the number of nanoparticles, a more practical approach is to consider the total capacitance in terms of the physical dimensions of the apparatus. Starting from Equation 1, the total capacitance can be rewritten as $$C_{total} \approx \rho(A_{gate}c_{gate} + 2A_{guard}c_{guard} + A_{channel}c_{channel} + A_{shield}c_{self}) \qquad \text{Equation 3}$$

where "$\rho$" is the nanoparticle area density, "$A_x$" are the approximate areas of the gate electrode, side guards, channel and shield layer, and "$c_x$" are the capacitances of a single nanoparticle relative to either the electrodes or the surrounding environment. The term "$c_{self}$" is given by $$c_{self} = 4\pi\varepsilon_0 \frac{r}{2} \qquad \text{Equation 4}$$

where "$\varepsilon_0$" is the permittivity of free space and "r" is the particle diameter. On the other hand, the term "$c_x$" for x={gate, guard, channel} may be approximated as the capacitance of a sphere in front of a plate electrode, given by $$c_x = 4\pi\varepsilon \frac{r}{2}\Theta \qquad \text{Equation 5}$$

where $$\Theta \approx \ln 2 + \gamma - \frac{1}{2}\ln\left(\frac{4t}{r} - 2\right) \qquad \text{Equation 6}$$

"$\gamma$" is Euler's constant approximately equal to 0.5772, and t is the distance between the nanoparticle and the plate electrode. If $t \approx r$ and $\varepsilon = \varepsilon_0$, the total capacitance of the shield layer is given by $$C_{total} \approx 4\pi\varepsilon \frac{r}{2}\rho\Theta\left(A_{gate} + 2A_{guard} + A_{channel} + \frac{A_{shield}}{\Theta}\right) \qquad \text{Equation 7}$$

For the self-capacitance of the shield layer to dominate the total capacitance, $A_{shield} \gg \Theta(A_{gate} + 2A_{guard} + A_{channel})$. A key requirement, however, is that the capacitance between the shield layer and ground ($C_{self}$) is far greater than the capacitance between the gate electrode and the shield layer ($C_{gate}$). If we approximate the shield layer as a continuous film of area "$A_{shield}$" between a gate electrode of area "$A_{gate}$" and potential "$V_{gate}$" and a channel of area "$A_{channel}$" (where $A_{channel} \gg A_{shield}$), and assume that the potential of the channel is at ground, then the potential of the shield layer can be approximated as $$V_{shield} \approx \frac{A_{gate}}{A_{gate} + A_{shield}} V_{gate} \qquad \text{Equation 8}$$

Therefore, as long as the area of the gate electrode is a small fraction (e.g. <20%, <10% or <5%) of the total area of the shield layer, then the gate potential will be effectively screened. It should be emphasised that Equation 8 only holds true for the compressed state (FIG. 6a) where the inter-particle tunneling resistance is negligible.

Furthermore, in the compressed state, an important effect is that the potential of the nanoparticles located beneath the gate electrode is more equal to the potential of the nanoparticles that are not located beneath the gate electrode. Therefore, if the side guards, the surrounding environment and/or other grounded electrodes capacitively ground the underlying nanoparticles in the shield layer, then this ground potential is conducted more efficiently to the nanoparticles located beneath the gate electrode, which has a marked impact on the electric field experienced by the conduction channel.

Figure 7:
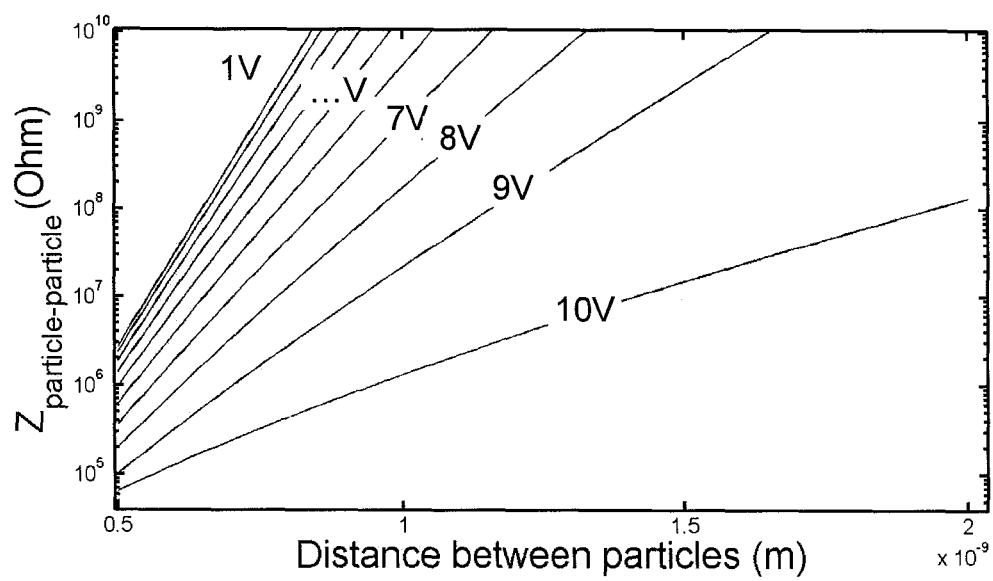
FIG. 7 shows how the calculated impedance between adjacent nanoparticles varies with inter-particle distance at different bias voltages.

Between the two extremes illustrated in FIGS. 6a and 6b, the tunneling resistance (quantum mechanical coupling) varies exponentially with inter-particle separation and bias voltage (i.e. the potential difference between adjacent nanoparticles). FIG. 7 illustrates this for an inter-particle separation of between 0.5 nm and 2.0 nm and a bias voltage of between 1V and 10V. While there is no direct potential applied to the shield layer in the present apparatus, a potential is induced on the nanoparticles as a function of the potentials applied to the other electrodes/layers in the system (including the gate electrode, the channel and the guard electrodes). The potential difference between adjacent nanoparticles additionally depends on the nanoparticle orientation relative to the other electrodes in the system.

Figure 8:
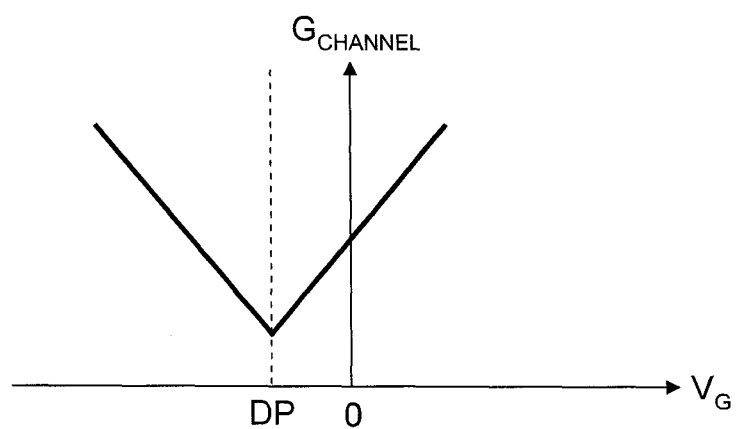
FIG. 8 shows how the conductance of a graphene field effect transistor varies with gate voltage.

As mentioned previously, the conduction channel may be formed from graphene. Graphene is an ambipolar material and exhibits a conductivity minima at the so-called Dirac point (DP). The change in graphene channel conductance with gate voltage is illustrated in FIG. 8. In pure intrinsic graphene without any impurities or defects, the DP is located at 0V. In practice, however, the DP is usually shifted from this position and can even be tuned by controlled doping of the graphene.

Figure 9:
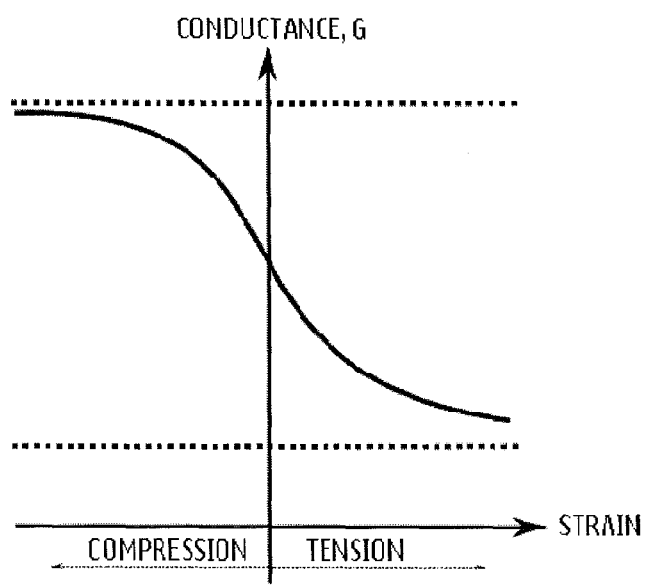
FIG. 9 shows how the conductance of the field effect transistor of FIG. 2 is predicted to vary with strain.

FIG. 9 shows how the conductance of a graphene-based FET deformation sensor is predicted to vary with compressive and tensile stress/strain. When the gate voltage is zero, the depletion region is negligible and the conductance of the channel is large. This is represented by the dotted line at the top of the graph. In a conventional FET operating in depletion mode (i.e. without the shield layer of the present apparatus), the applied field of the gate electrode decreases the density of charge carriers in the channel if the polarity of the applied field is correct. This is represented by the dotted line at the bottom of the graph. When a deformable shield layer is added to the structure, however, the electrically conducting nanoparticles act to modulate the electric field of the gate electrode. The degree of modulation depends (at least in part) on the spacing of the nanoparticles, which, as discussed previously, is controlled by physical deformation of the apparatus. When the shield layer undergoes compressive strain, the conductance of the channel increases until it reaches a maximum (corresponding to the scenario illustrated in FIG. 6a where the nanoparticles form a continuous metallic film). When the shield layer undergoes tensile strain, the conductance of the channel decreases until it reaches a minimum (corresponding to the scenario illustrated in FIG. 6b where the nanoparticles are physically isolated and effectively decoupled from one another). It should be noted, however, that the terms "maximum" and "minimum" as used above refer to the conductance of the channel at a particular gate potential, and could therefore be varied by adjusting the gate potential.

It is important to note, however, that the applied gate voltage should not coincide with the DP of the graphene channel, otherwise compressive and tensile stress could result in the same output conductance making it difficult to determine the physical state of the apparatus.

Figure 10:
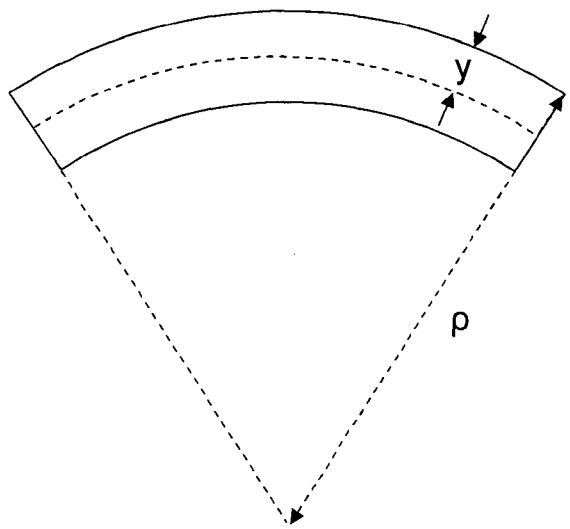
FIG. 10 shows the maximum radius of curvature of a given material.

Mechanical deformation of the shield layer to cause a change in the channel conductance may be performed by bending/flexing, compressing or stretching the apparatus and/or the device comprising the apparatus. Different materials allow for different degrees of mechanical deformation. The maximum radius of curvature ($\rho$) for a given material (FIG. 10) may be approximately estimated using the following equation $$\rho = \frac{y}{\varepsilon}$$ Equation 9 where $\gamma$ is half the thickness of the material and E is the strain. The dependence of tunneling resistance on bias voltage (see FIG. 7), however, means that the sensitivity of the system to mechanical deformation may be tailored for a specific material or application by adjusting the bias voltage. A sensitivity of 0.5%-1.0% is expected, which is comparable to existing deformation sensors formed using strain gauges.

Figure 11:
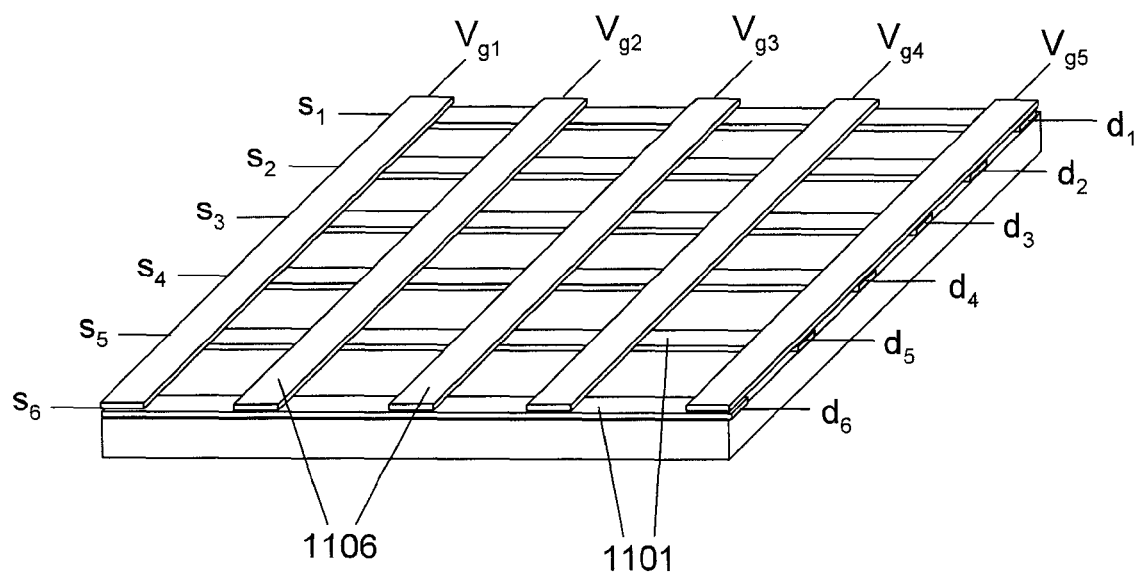
FIG. 11 shows a plurality of field effect transistors arranged to form a multiplexing architecture.

As mentioned, it is possible to form a multiplexing architecture from a plurality of FETs to allow measurement of the spatial distribution of the deformation. FIG. 11 illustrates a two-dimensional sensor array comprising six conduction channels 1101 and five gate electrodes 1106. The sensor array may also comprise side guards adjacent to the gate electrodes 1106 as described previously. Each channel 1101 is configured to enable a flow of charge carriers from a source electrode (labelled "$s_1$" to "$s_6$") to a drain electrode (labelled "$d_1$" to "$d_6$"), and each gate electrode 1106 is configured to control the density of charge carriers using an electric field. The voltage of each gate electrode 1106 is labelled "$V_{g1}$" to "$V_{g5}$". The conduction channels 1101 and gate electrodes 1106 may be formed from (doped) graphene ribbons. In this example, the channels 1101 are arranged substantially parallel to one another, the gate electrodes 1106 are arranged substantially parallel to one another, and the channels 1101 are arranged substantially perpendicular to the gate electrodes 1106 (although other configurations are possible). In this configuration, each gate electrode 1106 is able to control the flow of current through each of the different channels 1101.

FIGS. 12a to 12d illustrate the principle of operation of the two-dimensional sensor array. A pulsed voltage is applied to each of the gate electrodes 1206 sequentially (whilst the other gate electrodes are grounded) and the conductance of each channel 1201 is measured separately.

Figure 12A:
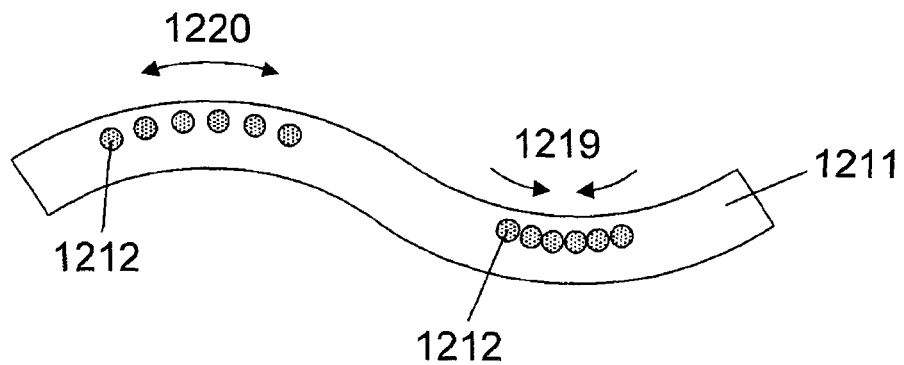
FIG. 12*a* shows how the inter-particle spacing varies with compressive and tensile stress.
Figure 12B:
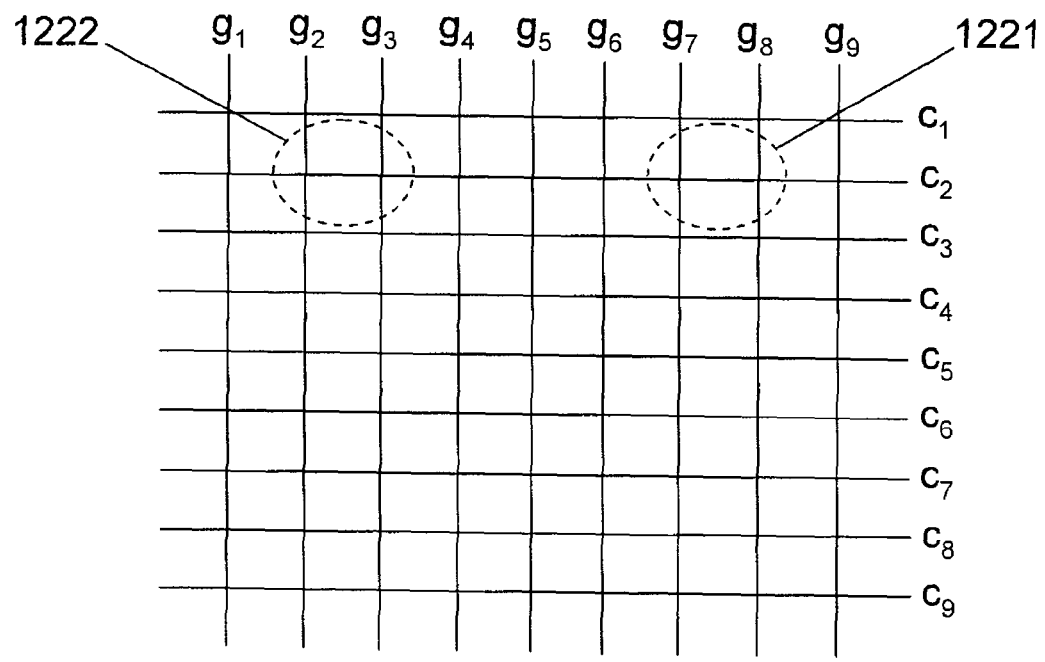
FIG. 12*b* shows points of strain on the multiplexing architecture of FIG. 11.

FIG. 12a shows the shield layer 1211 (in cross-section) undergoing compressive 1219 and tensile 1220 strain as the apparatus is bent. As can be seen, the tensile strain 1220 causes the electrically conducting nanoparticles 1212 to be spread apart from one another, whilst the compressive strain 1219 causes the electrically conducting nanoparticles 1212 to move closer together. FIG. 12b shows the apparatus in plan view. In this figure, the letter "$c_n$" denotes channel "n" and the letter "$g_n$" denotes gate electrode "n". In this particular example, the compressive 1219 and tensile 1220 strain affects channel $c_2$ at gates $g_2$, $g_3$, $g_7$ and $g_8$, as indicated by the dashed ovals 1221 and 1222, respectively.

Figure 12C:
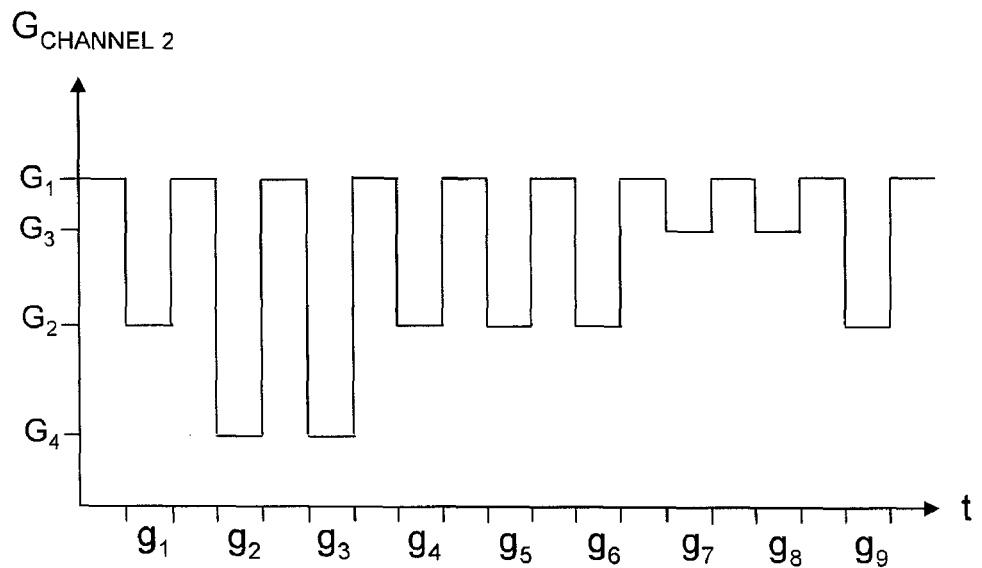
FIG. 12*c* shows how the conductance of channel 2 varies with time under the influence of compressive and tensile stress.
Figure 12D:
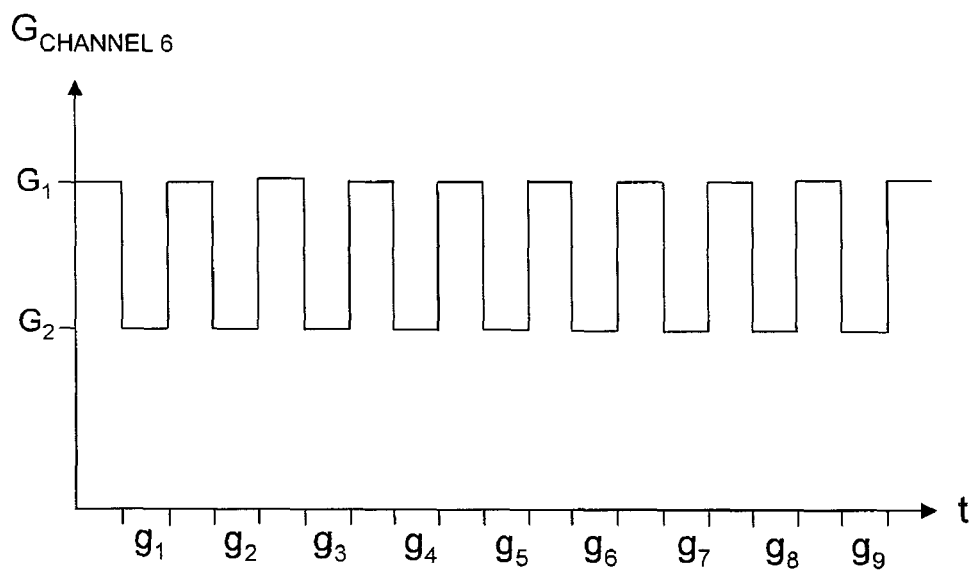
FIG. 12*d* shows how the conductance of channel 6 varies with time under the influence of compressive and tensile stress.

FIGS. 12c and 12d show the conductance values for channels $c_2$ and $c_6$. Referring first to FIG. 12d, the conductance of channel $c_6$ is constant over time. This shows that no compressive or tensile stress is being applied to the apparatus at any of the junctions between gate electrodes $g_1$-$g_9$ and channel $c_6$. In contrast, FIG. 12c shows that the conductance of channel $c_2$ varies over time. In particular, the graph shows that the conductance decreased (relative to the conductance associated with no applied stress) when a voltage was applied to gate electrodes $g_2$ and $g_3$, but increased when a voltage was applied to gate electrodes $g_7$ and $g_8$. These readings indicate that tensile stress is being applied to the junctions between channel $c_2$ and gate electrodes $g_2$ and $g_3$ (i.e. the increased particle spacing reduces shielding of the electric field), and compressive stress is being applied to the junctions between channel $c_2$ and gate electrodes $g_7$ and $g_8$ (i.e. the decreased particle spacing increases shielding of the electric field).

As can be seen from the above example, the multiplexing architecture allows a user to determine which channel-gate junctions of the sensor array are undergoing compressive or tensile strain. In this way, it is possible to pin-point applied forces and/or determine the overall shape of the deformation sensor. Whilst a two-dimensional sensor array has been described above, the same concept could be adapted to form a one or three-dimensional sensor.

Figure 13:
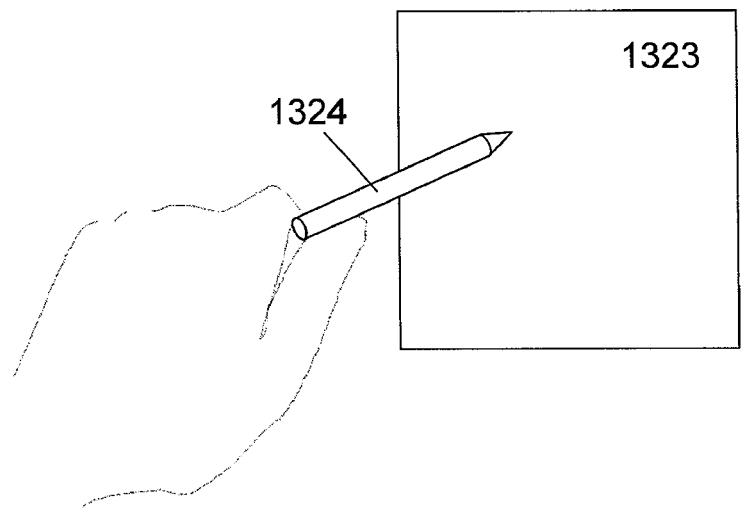
FIG. 13 shows a touch-user interface comprising the apparatus described herein.

Potential applications of the present apparatus include strain sensing, joint flexure sensing and touch-user interfaces. For example, if the strain vs conductance curve was calibrated, it would be possible to determine the level of strain at particular points on the apparatus simply by measuring the conductance of each channel. This information may be particularly useful in the construction and electronic packaging industries. Shape detection, on the other hand, could be of use in joint flexure sensing applications, such as in sports training, sports therapy, or even gaming applications. In such applications, the user would be required to wear the material during a physical activity to monitor his/her physical form. FIG. 13 illustrates a touch-user interface 1323. Using the two-dimensional sensor array described above, the system could determine the point of contact (compressive or tensile stress) between a stylus 1324 (or the user's finger) and the interface 1323 based on the conductance values and perform operations corresponding to the detected position.

Furthermore, if the shield layer is configured to undergo reproducible thermal expansion or contraction, then the apparatus could potentially be used to deduce the system temperature (i.e. it may be used as a thermal sensor) using the strain values determined from the conductance measurements. This would require prior calibration of the strain with temperature.

Figure 14:
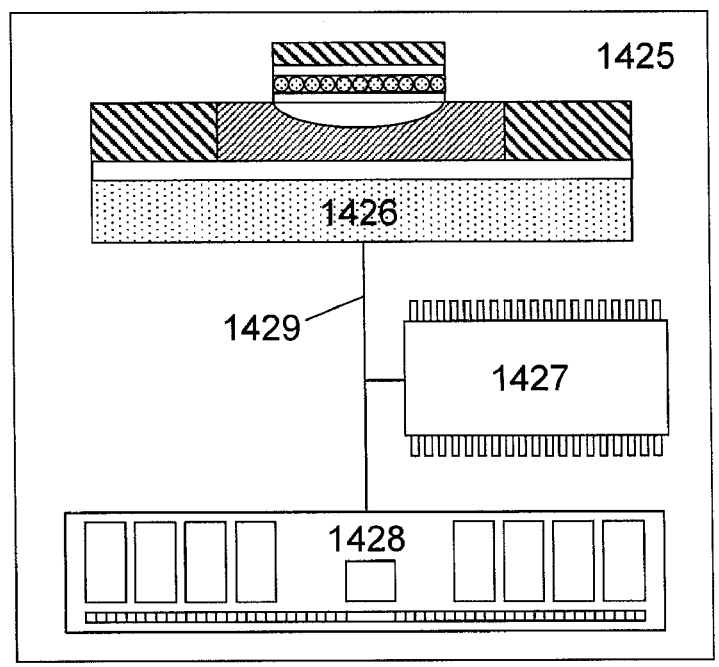
FIG. 14 shows a device comprising the apparatus described herein.

FIG. 14 illustrates schematically a device 1425 comprising the deformation sensor 1426 described herein. The deformation sensor 1426 may be provided on top of the device 1425 as a surface coating. The device 1425 also comprises a processor 1427, and a storage medium 1428, which are electrically connected to one another by a data bus 1429. The device 1425 may be an electronic device, a portable electronic device, a portable telecommunications device, an electronic display for any of the aforementioned devices, or a module for any of the aforementioned devices.

The deformation sensor 1426 is configured to measure the conductance of each channel (or possibly the current flowing through each channel from which the conductance can be calculated) to enable deformation of the sensor 1426 to be detected.

The processor 1427 is configured for general operation of the device 1425 by providing signaling to, and receiving signaling from, the other device components to manage their operation. The processor 1427 may also be configured to calculate the conductance of each channel using the applied source-drain voltage and the current readings. Depending on the particular application, the processor 1427 may use this conductance data to locate the position of applied forces, determine the location and magnitude of stresses or strains in the system, determine the system temperature, and/or calculate the shape of the sensor 1426.

The storage medium 1428 is configured to store computer code configured to perform, control or enable the making and/or operation of the deformation sensor 1426, as described with reference to FIG. 17. The storage medium 1428 may also be configured to store settings for the other device components. The processor 1427 may access the storage medium 1428 to retrieve the component settings in order to manage the operation of the other device components. In particular, the storage medium 1428 may comprise a series of previously measured channel currents or conductances from which the type (i.e. compressive or tensile) and magnitude of stress or strain can be determined. Similarly, the storage medium 1428 may comprise a series of previously determined stresses or strains from which the temperature can be deduced. The storage medium 1428 may be a temporary storage medium such as a volatile random access memory. On the other hand, the storage medium 1428 may be a permanent storage medium such as a hard disk drive, a flash memory, or a non-volatile random access memory.

Figure 15:
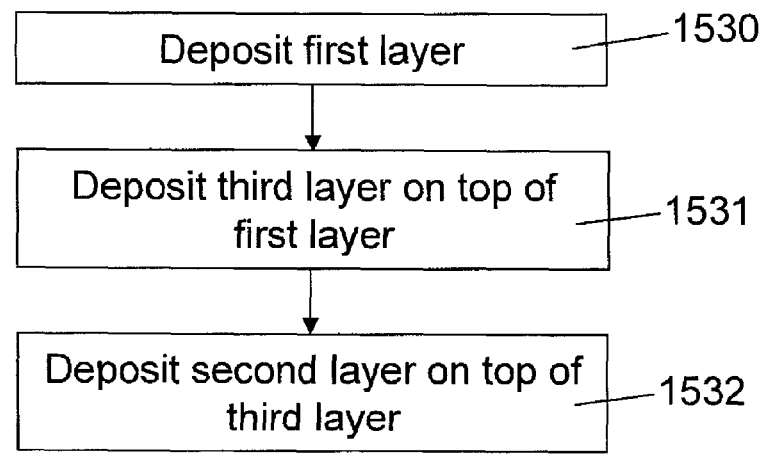
FIG. 15 shows a method of making the apparatus described herein.
Figure 16:
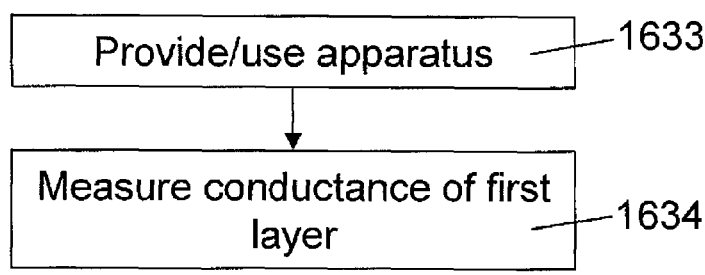
FIG. 16 shows a method of using the apparatus described herein.

The main steps 1530-1532 of the method used to make the apparatus 1426 are illustrated schematically in FIG. 15. Likewise, the main steps 1633-1634 of the method used to operate the apparatus 1426 are illustrated schematically in FIG. 16.

Figure 18:
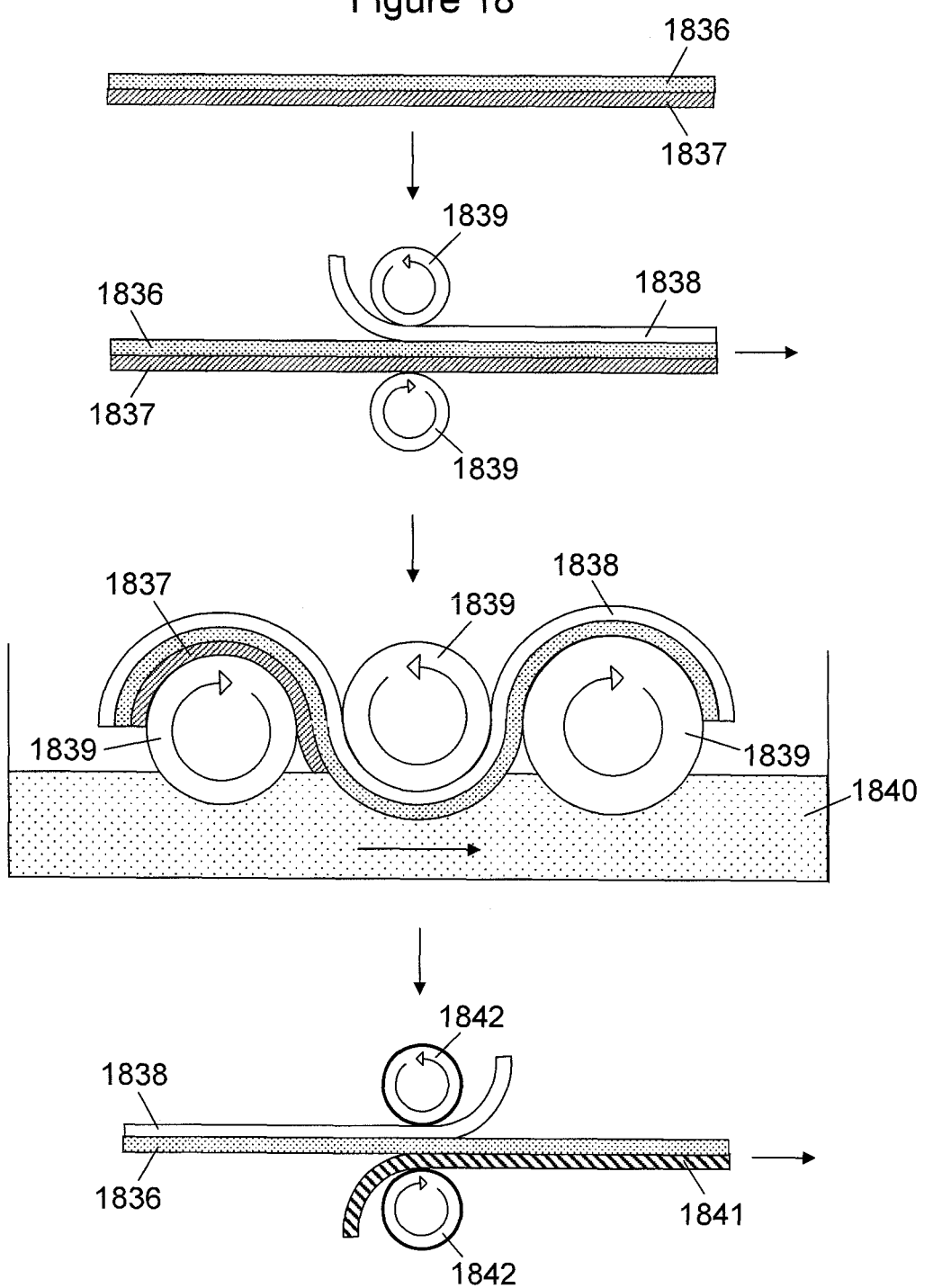
FIG. 18 shows a roll-to-roll production method for fabricating graphene films.

As discussed previously, graphene may be used to form the conduction channel(s), the gate electrode(s), the side guards, and possibly also the source and drain electrodes. FIG. 18 illustrates a low cost method of fabricating graphene films which could be used to form the conduction channel(s) on top of a flexible supporting substrate. The shield layer and gate electrode(s) can then be fabricated on top of the graphene channels. It should be noted, however, that there are a number of different methods for growing and transferring graphene films, and any of these processes may be used to form the apparatus described herein.

The first step of the fabrication process is the growth of a graphene film 1836 on a roll of copper foil 1837 using chemical vapour deposition. To achieve this, the roll of copper foil 1837 is inserted into a tubular quartz reactor and heated to 1000° C. in a flow of $H_2$ at 10 sccm and 180 mTorr. The copper foil 1837 is then annealed for 30 mins at 1000° C. without changing the flow rate or pressure. A gas mixture of $CH_4$ and $H_2$ is then flowed at 1.6 Torr at a flow rate of 30 sccm and 10 sccm for 15 mins, respectively. After this, the copper foil 1837 is rapidly cooled to room temperature at a rate of ~10° C./sec in a flow of $H_2$ at a pressure of 180 mTorr.

After growth of the graphene film 1836, a layer of thermal release tape 1838 is attached to the graphene film 1836 by compressing the materials between two rollers 1839 at a pressure of ~0.2 MPa. This step results in the graphene film 1836 being sandwiched between the thermal release layer 1838 and the copper foil 1837. The next step is the removal of the copper foil 1837. This is achieved by passing the material through a bath of copper etchant 1840. As can be seen in FIG. 18, the material may be transported using a set of rollers 1839. When using three rollers 1839, the material passes through the etchant 1840 once, but a greater number of rollers 1839 could be used in order to expose the material to the etchant 1840 more than once. Rather than using rollers 1839, the etchant 1840 could be sprayed onto the copper foil 1837, or the material could be immersed in the etchant 1840 for a predetermined period of time. Gentle agitation could be used with any of these techniques to further facilitate removal of the copper foil 1837. After etching the copper foil 1837, the material is rinsed with deionised water to remove any residual etchant 1840. The result of this step is a graphene film 1836 supported only by a layer of thermal release tape 1838.

The next step in this process is the transfer of the graphene film 1836 from the thermal release layer 1838 to the substrate of choice 1841. The graphene film 1836 supported by the thermal release tape 1838 is passed through a set of heated rollers 1842 together with the target substrate 1841 and heated to between 90-120° C. for 3-5 mins. At this temperature, the thermal energy causes the thermal release tape 1838 to break free from the graphene film 1836. Compression of the materials at this temperature also allows the graphene film 1836 to bind to the target substrate 1841.

The roll-to-roll process (described above) results in a single continuous graphene film 1836. The film 1836 now needs to be patterned into multiple graphene ribbons to form the various channels. This may be performed by etching the graphene film 1836 through a mask layer (deposited onto the graphene in the shape of the desired pattern) to remove the graphene from the exposed regions (not shown). The mask layer (which may be a electron resist, a photoresist or a polymer layer) can then be removed once the etch is complete. Following removal of the mask layer, the shield layer 211 and gate electrode(s) 206 can then be fabricated on top of the graphene channels to form the deformation sensor 1426 described herein.

Regarding fabrication of the shield layer, there are a number of different techniques that could be used to form the nanoparticle monolayer. One method relies on the use of Langmuir-Blodgett assembly. In this method, the nanoparticles are assembled at a water-air interface (and initially well separated) and then compressed in a Langmuir-Blodgett trough. As compression continues, the nanoparticles self-assemble into well-ordered close-packed monolayers. Another method relies on the self-assembly of nanoparticles between two immiscible phases. This technique requires the nanoparticles to be functionalised in a particular way to make them insoluble in either of the two immiscible phases. In both assembly methods, extraction of the monolayer from the liquid surface may be performed using a horizontal or vertical dipping process. This involves bringing a substrate into contact with the monolayer to cause the monolayer to stick to the substrate rather than remain on the liquid surface.

The gate electrodes, side guards, source electrodes and drain electrodes may be fabricated from multiple layers of graphene platelets. To achieve this, an electrode formulation (e.g. comprising graphene platelets dispersed within a conductive polymer binder) may be prepared as an ink and deposited using any standard printing (including inkjet, flexography, gravure, or screen and pad printing) or coating (including slot coating, bar coating, rod coating, air-knife coating, slide-hopper coating, or curtain coating) process.

The electrode formulation may be prepared using the following method. It should be noted, however, that the quantities and parameters mentioned may be varied in order to scale-up production. First, graphene oxide is prepared by oxidizing natural graphite powder (SP, 320 mesh) based on a modified Hummers method, as described in the research publication entitled "*Layer-by-Layer Assembly of Ultrathin Composite Films from Micron-Sized Graphite Oxide Sheets and Polycations*", by N. Kovtyukhova et al, Chem. Mater. 11, 771 (1999). The graphene oxide is then suspended in ultra-pure water to give a brown dispersion and subjected to dialysis for 4 days to completely remove residual salts and acids. The resulting purified graphene oxide powder is collected by centrifugation and then air-dried. Following this, the graphene oxide powder is dispersed in water to create a 0.05 wt % dispersion, and is then exfoliated through ultrasonication for 1 h, during which process the bulk graphene oxide powder is transformed into graphene oxide platelets. The graphene oxide platelets are then dispersed within a conductive polymeric binder of choice (which will vary depending on the particular printing or coating process), and used as a printable ink to form the electrodes and/or side guards. Rather than using a conductive polymer binder, the graphene platelets may be suspended within an organic solvent. Once deposited, the solvent can be evaporated to leave layers of graphene platelets.

Figure 17:
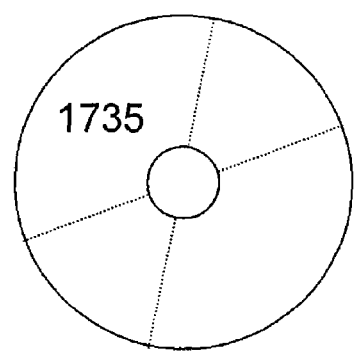
FIG. 17 shows a computer readable medium comprising a computer program for controlling the making and/or use of the apparatus described herein.

FIG. 17 illustrates schematically a computer/processor readable medium 1735 providing a computer program according to one embodiment. In this example, the computer/processor readable medium 1735 is a disc such as a digital versatile disc (DVD) or a compact disc (CD). In other embodiments, the computer/processor readable medium 1735 may be any medium that has been programmed in such a way as to carry out an inventive function. The computer/processor readable medium 1735 may be a removable memory device such as a memory stick or memory card (SD, mini SD or micro SD).

The computer program may comprise computer code configured to perform, control or enable one or more of the following: deposition of a first layer; deposition of a third layer on top of the first layer; and deposition of a second layer on top of the third layer to form an apparatus comprising a first layer configured to enable a flow of charge carriers from a source electrode to a drain electrode, a second layer configured to control the density of charge carriers in the first layer using an electric field formed between the first and second layers, and a third layer positioned between the first and the second layers to shield the first layer from the electric field, wherein the third layer comprises a layer of electrically conducting nanoparticles and is configured such that when stress is applied to the third layer, the strength of the electric field experienced by the first layer is varied resulting in a change in the charge carrier density and a corresponding change in the conductance of the first layer.

The computer program may also be configured to perform, control or enable one or more of the following: provision/use of an apparatus comprising first layer configured to enable a flow of charge carriers from a source electrode to a drain electrode, a second layer configured to control the density of charge carriers through the first layer using an electric field formed between the first and second layers, and a third layer positioned between the first and second layers to shield the first layer from the electric field, wherein the third layer comprises a layer of electrically conducting nanoparticles and is configured such that when stress is applied to the third layer, the strength of the electric field experienced by the first layer is varied resulting in a change in the charge carrier density and a corresponding change in the conductance of the first layer; and measurement of the conductance of the first layer.

Other embodiments depicted in the figures have been provided with reference numerals that correspond to similar features of earlier described embodiments. For example, feature number 1 can also correspond to numbers 101, 201, 301 etc. These numbered features may appear in the figures but may not have been directly referred to within the description of these particular embodiments. These have still been provided in the figures to aid understanding of the further embodiments, particularly in relation to the features of similar earlier described embodiments.

It will be appreciated to the skilled reader that any mentioned apparatus/device/server and/or other features of particular mentioned apparatus/device/server may be provided by apparatus arranged such that they become configured to carry out the desired operations only when enabled, e.g. switched on, or the like. In such cases, they may not necessarily have the appropriate software loaded into the active memory in the non-enabled (e.g. switched off state) and only load the appropriate software in the enabled (e.g. on state). The apparatus may comprise hardware circuitry and/or firmware. The apparatus may comprise software loaded onto memory. Such software/computer programs may be recorded on the same memory/processor/functional units and/or on one or more memories/processors/functional units.

In some embodiments, a particular mentioned apparatus/device/server may be pre-programmed with the appropriate software to carry out desired operations, and wherein the appropriate software can be enabled for use by a user downloading a "key", for example, to unlock/enable the software and its associated functionality. Advantages associated with such embodiments can include a reduced requirement to download data when further functionality is required for a device, and this can be useful in examples where a device is perceived to have sufficient capacity to store such pre-programmed software for functionality that may not be enabled by a user.

It will be appreciated that any mentioned apparatus/circuitry/elements/processor may have other functions in addition to the mentioned functions, and that these functions may be performed by the same apparatus/circuitry/elements/processor. One or more disclosed aspects may encompass the electronic distribution of associated computer programs and computer programs (which may be source/transport encoded) recorded on an appropriate carrier (e.g. memory, signal).

It will be appreciated that any "computer" described herein can comprise a collection of one or more individual processors/processing elements that may or may not be located on the same circuit board, or the same region/position of a circuit board or even the same device. In some embodiments one or more of any mentioned processors may be distributed over a plurality of devices. The same or different processor/processing elements may perform one or more functions described herein.

It will be appreciated that the term "signaling" may refer to one or more signals transmitted as a series of transmitted and/or received signals. The series of signals may comprise one, two, three, four or even more individual signal components or distinct signals to make up said signaling. Some or all of these individual signals may be transmitted/received simultaneously, in sequence, and/or such that they temporally overlap one another.

With reference to any discussion of any mentioned computer and/or processor and memory (e.g. including ROM, CD-ROM etc), these may comprise a computer processor, Application Specific Integrated Circuit (ASIC), field-programmable gate array (FPGA), and/or other hardware components that have been programmed in such a way to carry out the inventive function.

The applicant hereby discloses in isolation each individual feature described herein and any combination of two or more such features, to the extent that such features or combinations are capable of being carried out based on the present specification as a whole, in the light of the common general knowledge of a person skilled in the art, irrespective of whether such features or combinations of features solve any problems disclosed herein, and without limitation to the scope of the claims. The applicant indicates that the disclosed aspects/embodiments may consist of any such individual feature or combination of features. In view of the foregoing description it will be evident to a person skilled in the art that various modifications may be made within the scope of the disclosure.

While there have been shown and described and pointed out fundamental novel features as applied to different embodiments thereof, it will be understood that various omissions and substitutions and changes in the form and details of the devices and methods described may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment may be incorporated in any other disclosed or described or suggested form or embodiment as a general matter of design choice. Furthermore, in the claims means-plus-function clauses are intended to cover the structures described herein as performing the recited function and not only structural equivalents, but also equivalent structures. Thus although a nail and a screw may not be structural equivalents in that a nail employs a cylindrical surface to secure wooden parts together, whereas a screw employs a helical surface, in the environment of fastening wooden parts, a nail and a screw may be equivalent structures.

The invention claimed is:

1. An apparatus comprising:
  a first layer configured to enable a flow of charge carriers from a source electrode to a drain electrode,
  a second layer configured to control the density of charge carriers in the first layer using an electric field formed between the first and second layers, and
  a third layer positioned between the first and second layers to shield the first layer from the electric field,
  wherein the third layer comprises a layer of electrically conducting nanoparticles and is configured such that when stress is applied to the third layer, the strength of the electric field experienced by the first layer is varied resulting in a change in the charge carrier density and a corresponding change in the conductance of the first layer; and
  wherein the first and/or second layers are formed from at least one or more layers of graphene.

2. The apparatus of claim 1, wherein the stress applied to the third layer is compressive, tensile or shearing stress.

3. The apparatus of claim 1, wherein the stress applied to the third layer causes one or more of the following: a change in the position of the nanoparticles, a change in the shape of the nanoparticles, a change in the orientation of the nanoparticles, and a change in the distance between adjacent nanoparticles.

4. The apparatus of claim 1, wherein the third layer is configured such that the distance between adjacent nanoparticles in the plane of the third layer is varied when a component of the stress is parallel to the plane of the third layer.

5. The apparatus of claim 1, wherein the apparatus is configured such that one or more of the first, second and third layers is reversibly deformable.

6. The apparatus of claim 1, wherein the apparatus is configured such that one or more of the third, second and the third layers is optically transparent.

7. The apparatus of claim 1, wherein the layer of electrically conducting nanoparticles comprises one or more monolayers of electrically conducting nanoparticles.

8. The apparatus of claim 1, wherein the apparatus is configured such that the electrically conducting nanoparticles are electrically coupled to one another by one or more of capacitive coupling and quantum mechanical coupling.

9. The apparatus of claim 8, wherein one or more of the orientation, density and separation of the electrically conducting nanoparticles is configured to enable the electrical coupling therebetween.

10. The apparatus of claim 1, wherein the third layer is formed from at least an electrically insulating material configured to prevent direct physical contact between adjacent electrically conducting nanoparticles of the third layer.

11. The apparatus of claim 10, wherein the electrically insulating material comprises a surfactant.

12. The apparatus of claim 1, wherein the apparatus comprises two or more channels, each channel configured to enable a flow of charge carriers from a source electrode to a drain electrode.

13. The apparatus of claim 12, wherein the apparatus comprises two or more gate electrodes, each gate electrode configured to control the density of charge carriers in one or more channels using an electric field formed between the gate electrode and the respective channels.

14. The apparatus of claim 13, wherein at least one of the two or more gate electrodes comprises side guards configured to confine the electric field of the gate electrode.

15. The apparatus of claim 13, wherein the channels and gate electrodes are arranged to form a multiplexing architecture.

16. A device comprising the apparatus of claim 1.

17. The device of claim 16, wherein the device is at least one of the following: an electronic device, a portable electronic device, a portable telecommunications device, an electronic display for any of the aforementioned devices, and a module for any of the aforementioned devices.

18. A method comprising:
  depositing a first layer formed from at least one or more layers of graphene;
  depositing a third layer on top of the first layer; and
  depositing a second layer formed from at least one or more layers of graphene on top of the third layer to form an apparatus comprising the first layer through which charge carriers flow from a source electrode to a drain electrode, the second layer controlling the density of charge carriers in the first layer using an electric field formed between the first and second layers, and the third layer positioned between the first and second layers to shield the first layer from the electric field, wherein the third layer comprises a layer of electrically conducting nanoparticles and is configured such that when stress is applied to the third layer, the strength of the electric field experienced by the first layer is varied resulting in a change in the charge carrier density and a corresponding change in the conductance of the first layer.

19. A method comprising:
providing/using an apparatus comprising a first layer formed from at least one or more layers of graphene through which charge carriers flow from a source electrode to a drain electrode, a second layer formed from at least one or more layers of graphene that control the density of charge carriers in the first layer using an electric field formed between the first and second layers, and a third layer positioned between the first and second layers to shield the first layer from the electric field, wherein the third layer comprises a layer of electrically conducting nanoparticles and is configured such that when stress is applied to the third layer, the strength of the electric field experienced by the first layer is varied resulting in a change in the charge carrier density and a corresponding change in the conductance of the first layer; and
measuring the conductance of the first layer.

* * * * *